United States Patent
Kim et al.

(10) Patent No.: US 11,538,692 B2
(45) Date of Patent: Dec. 27, 2022

(54) CYCLIC PLASMA ETCHING OF CARBON-CONTAINING MATERIALS

(71) Applicant: Tokyo Electron Limited, Tokyo (JP)

(72) Inventors: Yunho Kim, Albany, NY (US); Du Zhang, Albany, NY (US); Shihsheng Chang, Albany, NY (US); Mingmei Wang, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 17/327,305

(22) Filed: May 21, 2021

(65) Prior Publication Data
US 2022/0375759 A1      Nov. 24, 2022

(51) Int. Cl.
*H01L 21/311*    (2006.01)
*H01J 37/32*     (2006.01)

(52) U.S. Cl.
CPC .. *H01L 21/31116* (2013.01); *H01J 37/32834* (2013.01); *H01J 2237/334* (2013.01)

(58) Field of Classification Search
None
See application file for complete search history.

(56) References Cited

U.S. PATENT DOCUMENTS

| 9,378,971 | B1 | 6/2016 | Briggs et al. |
| 9,620,377 | B2 | 4/2017 | Hudson et al. |
| 2021/0391181 | A1* | 12/2021 | Chang ............... H01L 21/31144 |

OTHER PUBLICATIONS

Atlasov, Kirill A., et al., "Effect of sidewall passivation in BCl3/N2 inductively coupled plasma etching of two-dimensional GaAs photonic crystals," American Vacuum Society, J. Vac. Sci. Technol. B 27(5), Sep./Oct. 2009, 5 pages.

* cited by examiner

*Primary Examiner* — Roberts P Culbert
(74) *Attorney, Agent, or Firm* — Slater Matsil, LLP (57) ABSTRACT

A method for processing a substrate includes performing a cyclic process including a plurality of cycles, where the cyclic process includes: forming, in a plasma processing chamber, a passivation layer over sidewalls of a recess in a carbon-containing layer, by exposing the substrate to a first gas including boron, silicon, or aluminum, the carbon-containing layer being disposed over a substrate, purging the plasma processing chamber with a second gas including a hydrogen-containing gas, an oxygen-containing gas, or molecular nitrogen, and exposing the substrate to a plasma generated from the second gas, where each cycle of the plurality of cycles extends the recess vertically into the carbon-containing layer.

20 Claims, 8 Drawing Sheets

CYCLIC PLASMA ETCHING OF CARBON-CONTAINING MATERIALS

TECHNICAL FIELD

The present invention relates generally to a method of processing a substrate, and, in particular embodiments, to cyclic plasma etching of carbon-containing materials.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method for processing a substrate includes performing a cyclic process including a plurality of cycles, where the cyclic process includes: forming, in a plasma processing chamber, a passivation layer over sidewalls of a recess in a carbon-containing layer, by exposing the substrate to a first gas including boron, silicon, or aluminum, the carbon-containing layer being disposed over a substrate, purging the plasma processing chamber with a second gas including a hydrogen-containing gas, an oxygen-containing gas, or molecular nitrogen, and exposing the substrate to a plasma generated from the second gas, where each cycle of the plurality of cycles extends the recess vertically into the carbon-containing layer.

In accordance with an embodiment of the present invention, a method for processing a substrate includes performing a cyclic passivation process in a plasma processing chamber having a plasma source, the cyclic passivation process including a plurality of cycles, where a cycle of the cyclic passivation process includes: forming a passivation layer by exposing the substrate to a first gas including boron, silicon, or aluminum without powering the plasma source, the substrate including a carbon-containing layer, the first gas interacting with the carbon-containing layer to form the passivation layer, purging the plasma processing chamber with a second gas including hydrogen, and exposing the substrate to a plasma generated from the second gas by powering the plasma source.

In accordance with an embodiment of the present invention, a method for processing a substrate includes performing a plurality of cycles of a cyclic etch process to form a recess in a carbon-containing layer of a substrate loaded in a process chamber, each cycle including: forming a passivation layer from the carbon-containing layer by exposing the substrate to a plasma formed from a first gas including a hydrogen-containing gas, after turning OFF power to the plasma, purging the process chamber with a second gas including boron and a halogen, and purging the process chamber with the first gas and turning ON power to the plasma.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1K illustrate cross-sectional views of an example substrate during an example process of semiconductor fabrication comprising a cyclic etch process at various stages in accordance with various embodiments, wherein

FIGS. 2A-2C illustrate cross-sectional views of an example substrate during a cyclic etch process at various stages in accordance with alternate embodiments, wherein

FIGS. 3A-3C illustrate process flow charts of methods of cyclic etch process in accordance with various embodiments, wherein FIG. 3A illustrates an embodiment process flow (e.g., FIGS. 1C-1I)

DETAILED DESCRIPTION OF ILLUSTRATIVE EMBODIMENTS

This application relates to fabrication of semiconductor devices, for example, integrated circuits comprising semiconductor devices, and more particularly to memory devices, such as a 3D-NAND, 3D-NOR, or dynamic random access memory (DRAM) device as well as 3 D transistors. One of the challenges in the fabrication of such devices relates to forming a conformal, high aspect ratio feature (e.g., a contact hole) of a circuit element.

Embodiments of the present application disclose methods of forming a high aspect ratio features in a carbon-containing layer.

Various embodiments of this disclosure describe improved methods of anisotropically etching a carbon-containing layer with side-wall passivation. The inventors of this application have identified that conventional techniques for forming high aspect ratio features with plasma etching may cause a number of problems such as bowing, side-wall roughness, and striation especially when etching amorphous carbon layers used as etch mask. The inventors of this application have further identified that this may be likely caused by poor passivation of the sidewalls being formed during the etching.

In the following, FIGS. 1A-1K illustrate steps of semiconductor fabrication including the cyclic etch process in accordance with various embodiments. Steps in accordance with alternate embodiments are described in FIGS. 2A-2C. Several embodiment process flows of semiconductor fabrication are then described referring to FIGS. 3A-3C. An example plasma processing tool for the embodiment methods is illustrated in FIG. 4.

Figure 1A:
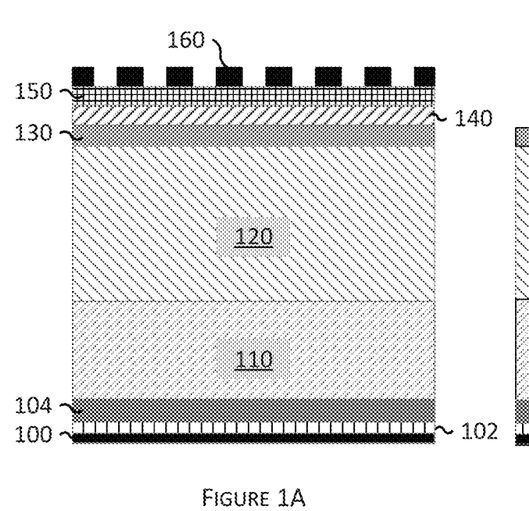
FIG. 1A illustrates an incoming substrate comprising a patterning layer stack, a carbon-containing layer, and an underlying layer stack.

FIG. 1A illustrates a cross-sectional view of an incoming substrate 100 comprising first intermediate layer 102 and second intermediate layer 104 formed over the substrate 100; an underlying layer 110 formed over the second intermediate layer 104; a carbon-containing layer 120 formed over the underlying layer 110; a hard mask layer 130 formed over the carbon-containing layer 120, a third intermediate layer 140 and a fourth intermediate layer 150 formed over the hard mask layer 130; and a patterned layer 160 formed over the fourth intermediate layer 150.

In one or more embodiments, the substrate 100 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein.

As further illustrated in FIG. 1A, the substrate 100 may include the first and the second intermediate layers 102 and 104 and the underlying layer 110, which collectively may be considered a bottom layer of a semiconductor device comprising the substrate 100. In certain embodiments, the first and the second intermediate layers 102 and 104 and the underlying layer no are a dielectric layer, and may comprise silicon oxide, silicon nitride, an alternating layer stack of oxide/nitride layers, or any suitable materials that might be used, e.g., in a three-dimensional 3D-NAND stack. Each of the first and the second intermediate layers 102 and 104 and underlying layer no is described further below.

The first intermediate layer 102 may be an oxide layer such as a silicon oxide layer and may function as an etch stop layer in various embodiments. The first intermediate layer 102 may be deposited over the substrate 100 using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the first intermediate layer 102 has a thickness between 10 nm and 30 nm.

The second intermediate layer 104 may be a silicon-based layer, such as a silicon nitride layer, and may function as a blocking layer to further support an etch stop layer in various embodiments. The second intermediate layer 104 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the second intermediate layer 104 has a thickness between 200 nm and 250 nm. Although these particular intermediate layers (the first and the second intermediate layers 102 and 104) between the substrate 100 and the underlying layer 110 are illustrated and described, the substrate 100 may omit these particular intermediate layers and/or include different intermediate layers.

The underlying layer 110 may be formed over the second intermediate layer 104. In various embodiments, the underlying layer no is a target layer that is to be patterned into one or more features with the carbon-containing layer 120 as an etch mask, as described further below. The feature being etched into another layer (e.g., the underlying layer 110 or, as described below, the carbon-containing layer 120) may be any suitable feature. For example, although this disclosure primarily describes "recesses" with respect to the figures of this disclosure, it will be appreciated that other suitable features might be formed in a semiconductor layer, including lines, holes, trenches, vias, and/or other suitable structures, using embodiments of this disclosure. In one embodiment, the underlying layer no may be a silicon oxide layer. In various embodiments, the underlying layer no may include a stack of films. In certain embodiments, the underlying layer no may comprise films of dielectric and/or conductive materials, such as oxide, silicon oxide, silicon nitride, silicon oxynitride, silicon carbide, titanium nitride, tantalum nitride, their alloys, and combinations thereof. In one embodiment, the underlying layer no may be alternating silicon oxide/silicon nitride layers. The underlying layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the underlying layer 110 has a thickness between 1 μm and 4 μm.

As still illustrated in FIG. 1A, the carbon-containing layer 120 is formed over the underlying layer no. In various embodiments, as described further below, the carbon-containing layer 120 may be etched to form a high aspect ratio feature, and be used an etch mask layer in subsequent etch steps (e.g., for etching the underlying layer no). The carbon-containing layer 120 may be deposited over the underlying layer no using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. In one embodiment, the carbon-containing layer 120 has a thickness between 0.2 μm and 5 μm. In an alternate embodiment, the carbon-containing layer 120 has a thickness between 1 μm and 5 μm.

In another alternate embodiment, the carbon-containing layer 120 has a thickness between 2 μm and 4 μm. In various embodiments, carbon-containing layer 120 may be amorphous carbon layer (ACL). In alternate embodiments, the carbon-containing layer 120 may be other suitable organic materials as a carbon mask, for example, spin-on carbon hard mask (SOH) materials, or silicon-containing anti-reflective coating films (SiARC). These materials may be formed by a coating process such as spin-on process The hard mask layer 130 may be formed over the carbon-containing layer 120. In various embodiments, the hard mask layer 130 may be used for pattering of the carbon-containing layer 120 during a cyclic etch process. The hard mask layer 130 may comprise silicon oxide in one embodiment. In various embodiments, the hard mask layer 130 may comprise silicon nitride, silicon carbonitride (SiCN), silicon oxynitride (SiON), or silicon oxycarbide (SiOC). In alternate embodiments, the hard mask layer 130 may comprise titanium nitride. Further, the hard mask layer 130 may be a stacked hard mask comprising, for example, two or more layers using two different materials. The first hard mask of the hard mask layer 130 may comprise a metal-based layer such as titanium nitride, titanium, tantalum nitride, tantalum, tungsten based compounds, ruthenium based compounds, or aluminum based compounds, and the second hard mask material of the hard mask layer 130 may comprise a dielectric layer such as $SiO_2$, silicon nitride, SiCN, SiOC, silicon oxynitride, silicon carbide, amorphous silicon, or polycrystalline silicon. The hard mask layer 130 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In one embodiment, the hard mask layer 130 has a thickness of about 50 nm to about 500 nm, e.g., 100 nm to 300 nm in one embodiment.

The third intermediate layer 140 may be formed over the hard mask layer 130. The third intermediate layer 140 is an optional layer and may be an organic dielectric layer (ODL) in various embodiments. In certain embodiments, the ODL may comprise a photo-sensitive organic polymer or an etch type organic compound. In certain embodiments, the ODL may be polyacrylate resin, phenol resin, polyamide resin, polyimide resin, unsaturated polyester resin, polyphenylenether resin polyphenylenesulfide resin, or benzocyclobutene (BCB). The third intermediate layer 140 may be deposited over the hard mask layer 130 using an appropriate spin-coating technique. In one embodiment, the intermediate layer 140 has a thickness between 100 nm and 800 nm.

Further, as illustrated in FIG. 1A, the fourth intermediate layer 150 may be formed over the third intermediate layer 140. The fourth intermediate layer 150 may be silicon anti-reflective coating (SiARC) films or other anti-reflective coating materials. The fourth intermediate layer 150 may be deposited over the third intermediate layer 140 using, for example, an appropriate spin-coating technique or a vapor deposition process. In one embodiment, the fourth intermediate layer 150 has a thickness between 20 nm and 40 nm.

Although these particular third and fourth intermediate layers 140 and 150 are illustrated and described, this disclosure contemplates the substrate 100 omitting the third intermediate layer 140 and/or the fourth intermediate layer 150, or including different intermediate layers.

In various embodiments, the patterned layer 160 may be a photoresist layer and patterned to enable formation of respective features in the carbon-containing layer 120. For example, the patterned layer 160 may serve as a first etch mask when forming respective features in the hard mask layer 130, and subsequently the formed features in the hard mask layer 130 may serve as a second etch mask during a cyclic etch process for removing the carbon-containing layer 120 such that the features of the patterned layer 160 cause corresponding features in the carbon-containing layer 120 to remain during a subsequent etch process, as described below. In certain embodiments, the photoresist layer may comprise 248 nm resists, 193 nm resists, 157 nm resists, EUV (extreme ultraviolet) resists, or electron beam (EB) sensitive resists. The patterned layer 160 may be deposited over the fourth intermediate layer 150 using a suitable spin-coating technique. In one embodiment, the patterned layer 160 has a thickness between 50 nm and 60 nm thick. The pattern of the patterned layer 160 may be formed using an appropriate lithography process, such as a EUV lithography process or an EB lithography process.

Features to be patterned using the patterned layer 160 may have a desired critical dimension, or width, for the patterned layer 160. In one embodiment, the width may be between 70 nm and 250 nm. In an alternate embodiment, the width may be about 90 nm. These values are provided for example purposes only, as the features to be patterned using the patterned layer 160 may have any suitable critical dimension. The width may be the critical dimension achievable for a photoresist film by the lithography system after developing.

All Figures in the disclosure, including the aspect ratios of features, are not to scale and for illustration purposes only.

Figure 1B:
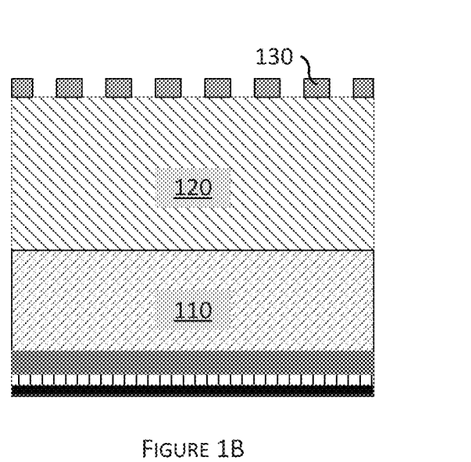
FIG. 1B illustrates the substrate after a patterning of a hard mask layer.

Illustrated in FIG. 1B, a plasma etch process may be performed to remove a section of the hard mask layer 130 to pattern the hard mask layer 130 using the patterned layer 160 as an etch mask. At this stage, a pattern defined by the patterned layer 160 may be transferred to the hard mask layer 130. The third and the fourth intermediate layers 140 and 150 and the patterned layer 160 may be removed as a part of this etch process in various embodiments. Although only the hard mask layer 130 is illustrated over the carbon-containing layer 120 in the example, this disclosure also contemplates a portion of the third intermediate layer 140 formed over the hard mask layer 130. In the following, a cyclic etch process to form a feature in the carbon-containing layer 120 with side-wall passivation is further described.

Figure 1C:
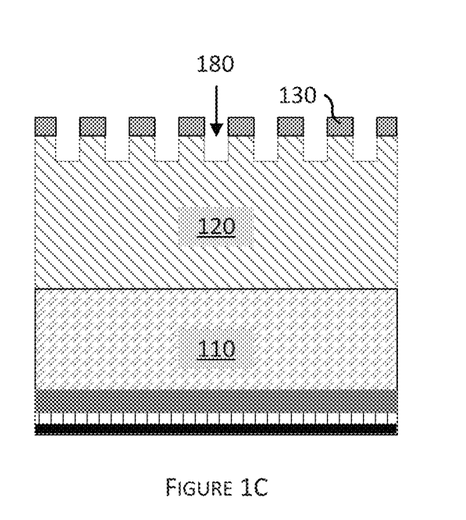
FIG. 1C illustrates the substrate after a first anisotropic plasma etch.

In FIG. 1C, the substrate 100 after a first anisotropic plasma etch process of a cyclic etch process is illustrated in accordance with one embodiment. The cyclic etch process may be performed in a suitable plasma processing chamber equipped with one or more plasma sources such as inductively coupled plasma (ICP), capacitively couple plasma (CCP), microwave plasma (MW), or others. A portion of the carbon-containing layer 120 is removed to form a vertical recess 180 that corresponds to the pattern of the hard mask layer 130. At this stage after the first plasma etch process, the vertical recess 180 has a height less than the thickness of the carbon-containing layer 120. In one embodiment, the vertical recess 180 has a height of around a quarter of the carbon-containing layer 120. The vertical recess 180 is to be extended stepwise by cycles of the cyclic etch process to form a high aspect ratio feature of the carbon-containing layer 120 as described further below.

In various embodiments, the first plasma etch process may be a reactive ion etching (RIE) process, and may use an etch gas, for example, comprising an oxygen-containing gas (e.g., $O_2$ or $CO_2$), a sulfur-containing gas (e.g., $SO_2$ or COS), or a nitrogen containing gas (e.g., $N_2$), or a hydrogen-containing gas (e.g., $H_2$ or $NH_3$). The etch gas may be a mixture of any of the example gases above mixed at any ratio with any combination. In addition, in certain embodiments, the etch gas may further comprise an optional admixture of inert gas comprising Ar, He, Xe, or Ne. In certain embodiments, the RIE process may be performed at a total gas flow between 1 sccm and 5000 sccm, a pressure between 1 mTorr and 760 Torr, a temperature between −100° C. and 200° C., and an operating frequency between 100 kHz and 10 GHz. In various embodiments, the RIE process may be performed with a process time between 10 s and 120 s, for example, 10 s to 30 s in one embodiment. To illustrate, in one embodiment, an etch time of the RIE process is 60 s, a pressure is 15 mTorr, a source power is 1500 W, a bias power is 400 W, an $O_2$ flow rate is 200 sccm, a $SO_2$ flow rate is 200 sccm, and an Ar flow rate is 50 sccm. The etch gas of the RIE process may be selected to provide good etch selectivity to mask materials such as $SiO_2$, silicon nitride, and SiON. Further, process parameters for the plasma etch process may be optimized with respect to subsequent passivation steps (e.g., FIGS. 1D and 1E) to provide good selectivity to a side-wall protective layer.

Figure 1D:
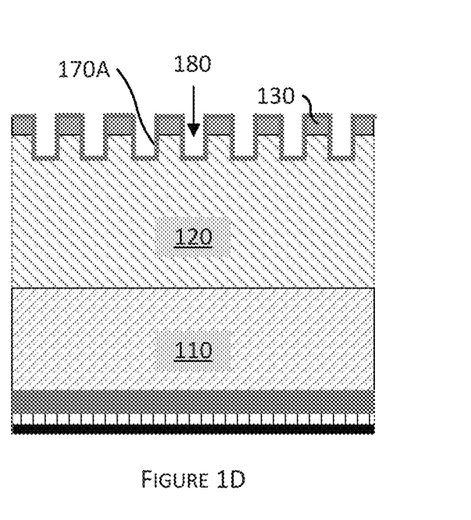
FIG. 1D illustrates the substrate after a first exposure to a first passivation gas.

Next, FIG. 1D illustrates the substrate after a first exposure of a first passivation gas to form an intermediate layer 170A over the carbon-containing layer 120 in the vertical recess 180. The intermediate layer 170A provides side-wall passivation in subsequent plasma etch process steps. In various embodiments, the formation of the intermediate layer 170A may be performed by exposing the substrate to a first passivation gas in the absence of a plasma (plasma-off passivation step, i.e., when power to plasma is turned OFF). At this stage, the first passivation gas may be adsorbed over the carbon-containing layer 120 in the vertical recess 180 and may thermally react with a surface of the carbon-containing layer 120 in the absence of a plasma. The intermediate layer 170A may be primarily adsorbed or polymerized species of the first passivation gas. The first passivation gas and process parameters may be selected to provide good selectivity to the hard mask layer 130, although not required. In the illustrated example embodiment in FIG. 1D, the adsorption of the first passivation gas on the carbon-containing layer 120 is not selective to the hard mask layer 130, wherein the intermediate layer 170A is formed over the carbon-containing layer 120 and the hard mask layer 130. Further, the absence of plasma-excitation during the exposure to the first passivation gas may advantageously enable conformal formation of the intermediate layer 170A in the vertical recess 180. The embodiment methods may also rely on less plasma usage, which may offer benefits of power efficiency and longer chamber lifetime.

In certain embodiments, the first passivation gas may comprise a boron-containing gas, a silicon-containing gas, or an aluminum-containing gas. Examples of the boron-containing gas comprise $BCl_3$, $BH_3$, and $BBr_3$. Examples of the silicon-containing gas comprise $SiCl_xH_{4-x}$ (x=0-4) and $Si_2Cl_xH_{6-x}$ (x=0-6). Examples of the aluminum-containing gas comprise $AlCl_3$ and $AlFx(CH_3)_{3-x}$ (x=0-2). In some embodiments, the first passivation gas may be a mixture of any of these gases above at any ratio. In addition, in certain embodiments, the first passivation gas may further comprise an optional admixture of inert gas comprising Ar, He, Xe, or Ne. In certain embodiments, the formation of the intermediate layer 170A may be performed at a total gas flow between 1 sccm and 5000 sccm, a pressure between 5 mTorr and 760 Torr, and a temperature between −100° C. and 200° C. In various embodiments, the plasma-off step with the first passivation gas may be performed with a process time between 1 s and 100 s, for example, 10 s to 300 s in one embodiment. Some process parameters such as flow rate, pressure may be selected to provide sufficient coverage of the side-walls by the intermediate layer 170A, while keeping process time as short as possible for better process efficiency. Further, process parameters for the plasma-off passivation step may be optimized with respect to the previous plasma etch process (e.g., FIG. 1C) and a subsequent passivation step (plasma-on passivation step) (e.g., FIG. 1E).

Figure 1E:
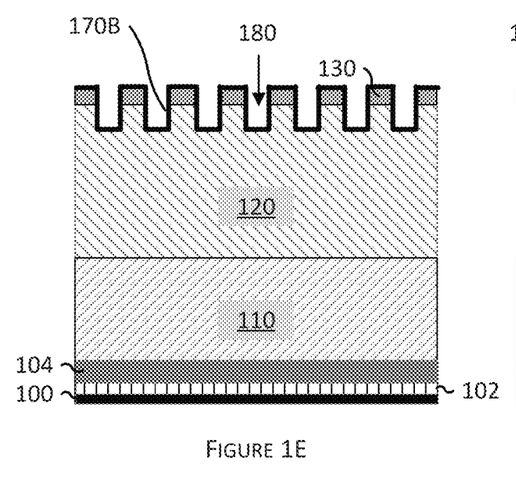
FIG. 1E illustrates the substrate after a first exposure to a plasma of a second passivation gas.

Subsequently, FIG. 1E illustrates the substrate 100 after a first exposure to a plasma of a second passivation gas. Unlike the exposure to the first passivation gas (plasma-off passivation step), this step of exposure to the second passivation gas is performed under a plasma condition (plasma-on passivation step). In various embodiments, the exposure to the plasma of the second passivation gas may modify the intermediate layer 170A chemically or physically to form a passivation layer 170B. Further, in certain embodiments, compared to the intermediate layer 170A, the passivation layer 170B may have improved etch resistivity, and thereby better side-wall passivation, in subsequent plasma etch processes In various embodiments, the second passivation gas may comprise a first hydrogen-containing gas, a first oxygen-containing gas, or molecular nitrogen ($N_2$). Examples of the first hydrogen-containing gas comprise $H_2$, $CH_4$, HBr, $CH_3F$, $H_2O$, $NH_3$, and combinations thereof. Examples of the first oxygen-containing gas comprise $O_2$, CO, $CO_2$, and combinations thereof. In certain embodiments, the second passivation gas may be a mixture comprising $H_2/N_2$, $H_2/O_2$, $H_2/CO$, $H_2/CO_2$, or $H_2/H_2O$. In some embodiments where the second passivation gas comprises hydrogen, the second passivation gas may further comprise an admixture gas comprising $O_2$, $CO_2$, CO, or $N_2$ mixed at any ratio. Although not wishing to be limited by any theory, radical species in the plasma of the second passivation gas may be responsible for modifying the intermediate layer 170A. Such a modification may lead to an enhanced side-wall passivation. Accordingly, plasma processing systems and parameters may be selected to achieve the optimized side-wall passivation. For example, in certain embodiments, it may be desired to have plasma systems such as inductively coupled plasma (ICP) or microwave plasma (MW) suitable for generating high density radicals for $H_2$ plasma. Further, in some embodiments, oxidative and/or nitrogen species may at least partially induce oxidation and/or nitridation of the intermediate layer 170A. In one embodiment, the first passivation gas comprises $BCl_3$ and the second passivation gas comprises $H_2$ and $N_2$.

In addition, in certain embodiments, the second passivation gas may further comprise an optional admixture of inert gas comprising Ar, He, Xe, or Ne. In certain embodiments, the exposure to the plasma of the second passivation gas may be performed at a total gas flow between 1 sccm and 5000 sccm, a pressure between 1 mTorr and 760 Torr, a temperature between −100° C. and 200° C., and an operating frequency between 100 kHz and 10 GHz. In various embodiments, the exposure to the plasma of the second passivation gas may be performed with a process time between 1 s and 300 s, for example, 1 s to 30 s in one embodiment. To illustrate in one embodiment, a process time is about 10-60 s, a pressure is about 5 mTorr to 1 Torr, a source power is about 500 W to 2500 W, a bias power is about 0 W to 500 W, an $H_2$ flow rate is about 100 sccm to 400 sccm, and an $N_2$ flow rate is about 10 sccm to 75 sccm. Some process parameters such as flow rate, pressure may be selected to provide sufficient modification of the intermediate layer 170A, while keeping process time as short as possible for better process efficiency. Further, process parameters for the plasma-on passivation step may be optimized with respect to the previous plasma etch process (e.g., FIG. 1C) and the plasma-off passivation step (e.g., FIG. 1D).

Figure 1F:
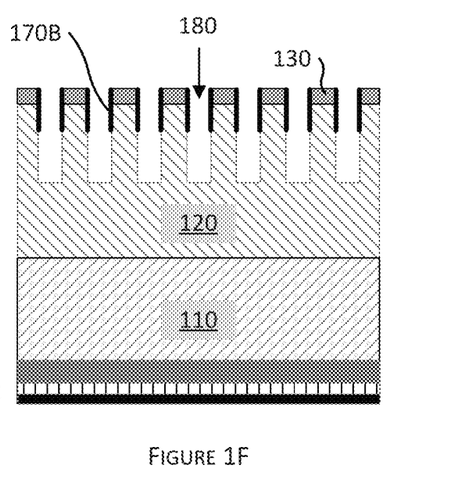
FIG. 1F illustrates the substrate after a second anisotropic plasma etch.

In the following, FIG. 1F illustrates the substrate 100 after a second anisotropic plasma etch process, corresponding to the beginning of a second cycle of the cyclic etch process. At this stage, the second anisotropic etch extends and deepens the vertical recess 180. With the carbon-containing layer 120 being removed anisotropically, the vertical recess 180 extends below the passivation layer 170B. A newly exposed outer surface of the carbon-containing layer 120 may be passivated in a subsequent step as below. In one embodiment, the vertical recess 180 at this stage has a height of about a half of the carbon-containing layer 120. During the second anisotropic plasma etch process, the passivation layer 170B provides side-wall passivation, thereby maintaining a conformal profile of the vertical recess 180. The presence of the passivation layer 170B reduces or prevents problematic "bowing," which is an undesired widening of an opening of a recess feature near the top of side-walls of the recess feature. This bowing may result in a widening of the critical dimension of a semiconductor device, and may ultimately also cause a collapse of fabricated features. The embodiment methods may mitigate or eliminate "bowing" by an enhanced side-wall passivation.

In various embodiments, the second anisotropic plasma etch process may be a second reactive ion etching (RIE) process. In various embodiments, the second RIE process may use the same etch gas and process parameters as the first RIE process. In certain embodiments, the second RIE process may use a modified etch gas composition and process parameters different from the first RIE process.

Figure 1G:
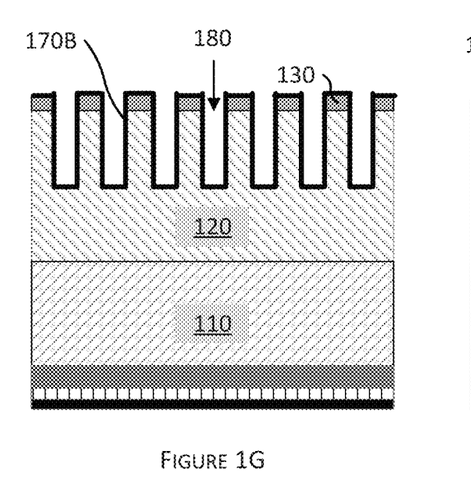
FIG. 1G illustrates the substrate after a second exposure to the first passivation gas followed by a second exposure to the second passivation gas.

Following the second anisotropic plasma etch process, the cyclic etch process proceeds to a second passivation series, that is, a second exposure to the first passivation gas in the absence of a plasma and a second exposure to the plasma of the second passivation gas (FIG. 1G). As illustrated in FIG. 1G, the passivation layer 170B may be deposited over the vertical recess 180. The passivation layer 170B may provide side-wall passivation during a subsequent, third anisotropic plasma etch process. In various embodiments, the second passivation series may use the same first and/or second passivation gas compositions and process parameters as the first passivation series. In certain embodiments, the second passivation series may use first and/or second passivation gas compositions and process parameters different from the first passivation series.

By performing a plurality of cycles of the cyclic etch process in accordance with various embodiments as illustrated above (e.g., FIGS. 1C-1E, respectively corresponding a anisotropic plasma etch process, a plasma-off passivation step, and a plasma-on passivation step), the vertical recess 180 may extend stepwise and conformally without much bowing or widening a critical dimension. In various embodiments, any number of cycles may be performed until a desired level of etching may be achieved. In certain embodiments, in one or more cycles, an anisotropic plasma etch process may be skipped so that a next passivation series may immediately follow a previous passivation series. Such embodiments may advantageously be useful in improving the etch resistivity of a passivation layer and/or ensuring the coverage of the entire recess by the passivation layer.

Figure 1H:
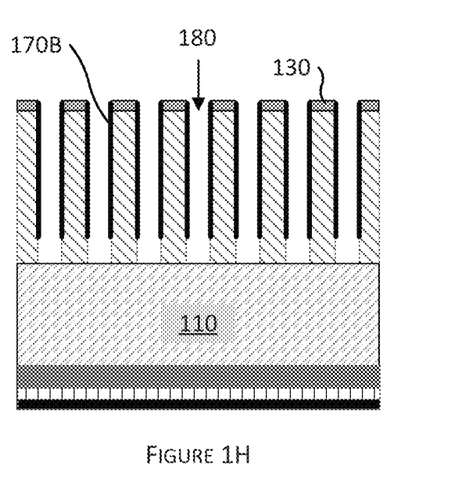
FIG. 1H illustrates the substrate after a plurality of etch and passivation cycles.

FIG. 1H illustrates the substrate after completing a plurality of cyclic etch cycles and after a final anisotropic plasma etch process. The vertical recess 180 extends to, and exposes the underlying layer no. The passivation layer 170E may be shorter in height than the vertical recess 180. In certain embodiments, a subsequent step of fabrication may immediately follow to etch the underlying layer no using the carbon-containing layer 120 that is patterned as an etch mask (FIG. 1J).

Figure 1I:
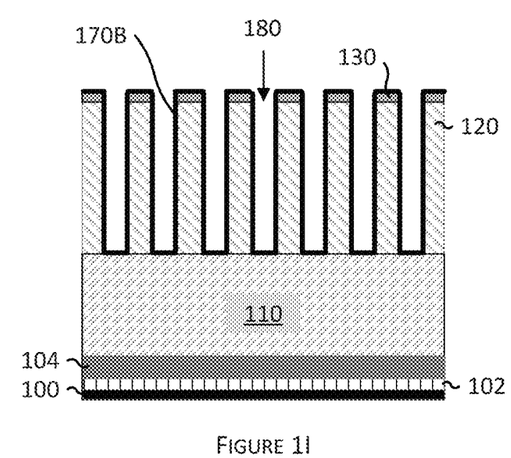
FIG. 1I illustrates the substrate after a final exposure to the first passivation gas followed by a final exposure to the second passivation gas after the cyclic etch process.

In alternate embodiments, as illustrated in FIG. 1I, after the final anisotropic plasma etch process, a final passivation series, that is, another exposure to the first passivation gas in the absence of a plasma (plasma-off passivation step) and another exposure to the plasma of the second passivation gas (plasma-on passivation step), may be performed. After the final passivation series, the passivation layer 170B entirely covers the side-walls of the carbon-containing layer 120. A subsequent step of fabrication may be performed to etch the underlying layer no using the carbon-containing layer 120 that is patterned as an etch mask (FIG. 1J). In another alternate embodiment, a final passivation may be performed by an exposure to the first passivation gas in the absence of a plasma but without exposing to the plasma of the second passivation gas.

Figure 1J:
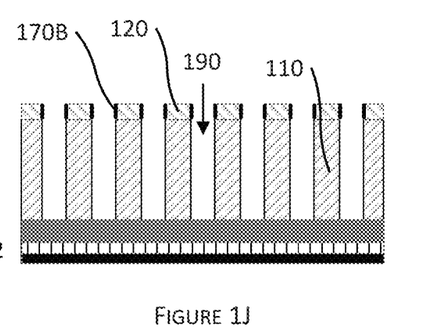
FIG. 1J illustrates the substrate after an anisotropic plasma etch of the underlying layer stack.

After the cyclic etch process, an etch process may be performed to pattern the underlying layer no with a high aspect ratio using the carbon-containing layer 120 as an etch mask (FIG. 1J). As illustrated in FIG. 1J, a vertical recess 190 may be formed in the underlying layer, transferring the pattern of the carbon-containing layer 120. The etch process may be performed using an appropriate etch technique such as a dry etch process or a wet etch process, and/or a combination thereof. In certain embodiments, the etch process for the underlying layer no may be performed in a different plasma system from the one used for the cyclic etch process; however, the etch process for the underlying layer no may be performed in the same plasma system as the one used for the cyclic etch process.

Figure 1K:
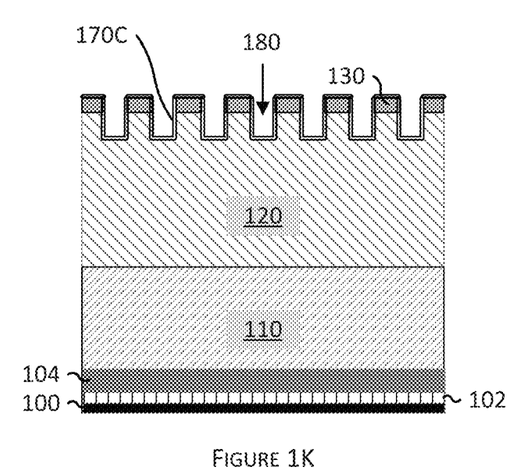
FIG. 1K illustrates, in another embodiment, the substrate after a first exposure to a plasma of a third passivation gas.

In alternate embodiments, the passivation of a cyclic etch process may additionally use a third passivation gas. FIG. 1K illustrates the substrate 100, in accordance with such embodiments, after a first exposure to a plasma of a third passivation gas as an additional step. The exposure to the plasma of the third passivation gas may be performed immediately after the first exposure to the plasma of the second passivation gas (e.g., after FIG. 1E). This additional step of exposure may form a further modified passivation layer 170C, which may also offer enhanced side-wall passivation. Although this additional step of exposure is illustrated and described as the additional step in the first cycle of the cyclic etch process, this disclosure contemplates such an addition of exposure to the plasma of the third gas in any one or more cycles during the cyclic etch process.

In various embodiments, the third passivation gas may comprise a second hydrogen-containing gas, a second oxygen-containing gas, or molecular nitrogen ($N_2$). Examples of the second hydrogen-containing gas comprise $H_2$, $CH_4$, HBr, $CH_3F$, $H_2O$, $NH_3$, and combinations thereof. Examples of the second oxygen-containing gas comprise $O_2$, CO, $CO_2$, and combinations thereof. In certain embodiments, the third passivation gas may be a mixture comprising $H_2/N_2$, $H_2/O_2$, $H_2/CO$, $H_2/CO_2$, or $H_2/H_2O$. In some embodiments where the third passivation gas comprises hydrogen, the third passivation gas may further comprise an admixture gas comprising $O_2$, $CO_2$, CO, or $N_2$. In addition, in certain embodiments, the third passivation gas may further comprise an optional admixture of inert gas comprising Ar, He, Xe, or Ne. The third passivation gas may have a different gas composition from the second passivation gas. In one embodiment, the first passivation gas comprises $BCl_3$, the second passivation gas comprises $H_2$, and the third passivation gas comprises $N_2$.

Figure 2A:
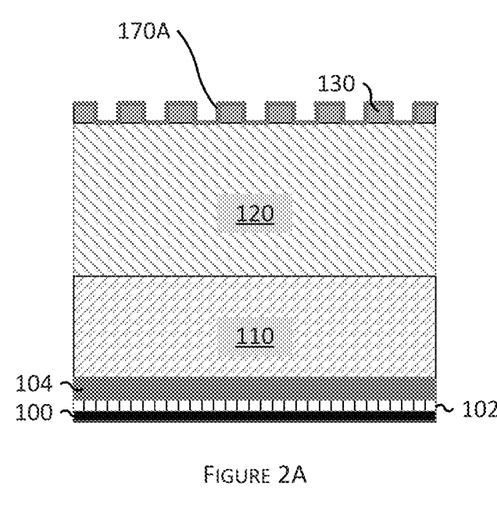
FIG. 2A illustrates an incoming substrate comprising a patterned hard mask layer, a carbon-containing layer, and an underlying layer stack, and illustrates the substrate after a first exposure to a first passivation gas.
Figure 2B:
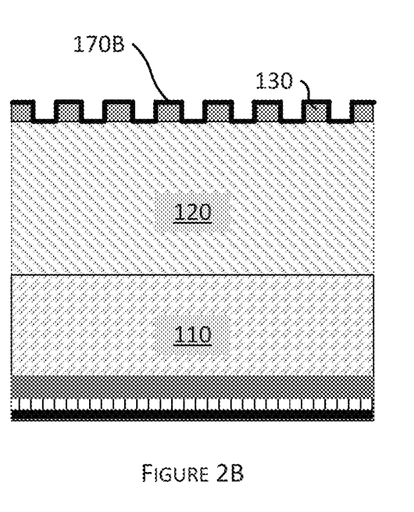
FIG. 2B illustrates the substrate after a first exposure to a plasma of second passivation gas.
Figure 2C:
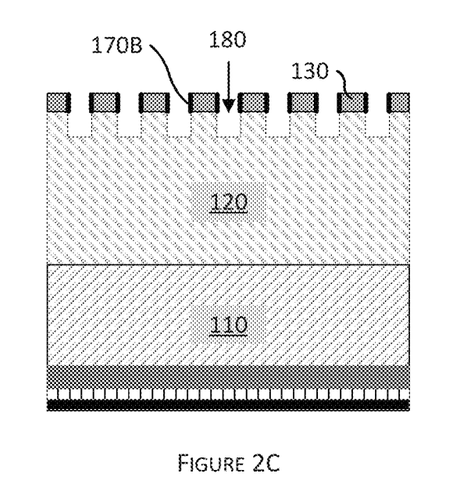
FIG. 2C illustrates the substrate after a first anisotropic plasma etch. Remaining process is the same as those illustrated in 1D-1J.

FIGS. 2A-2C illustrate cross-sectional views of an example substrate during a cyclic etch process at various stages in accordance with alternate embodiments.

Unlike the prior embodiment, in alternate embodiments, the cyclic etch process may start with the exposure to the first passivation gas (plasma-on passivation step) followed by a first anisotropic plasma etch process (FIGS. 2A-2C). In contrast, in the prior embodiment of FIGS. 1C-1E the cyclic etch process started with exposure to a first anisotropic plasma etch process followed by the first passivation gas (plasma-on passivation step).

FIG. 2A illustrates a substrate 100 after a first exposure to the first passivation gas. This process follows FIGS. 1A-1B described above. Therefore, similar to FIG. 1B, the substrate 100 comprises first and second intermediate layers 102 and 104, an underlying layer no, a carbon-containing layer 120, a hard mask layer 130. At this stage, as illustrated, there may not be a vertical recess in the carbon-containing layer 120 since no carbon-containing layer has been removed yet by the first anisotropic plasma etch process. However, in different embodiments, the incoming substrate 100 may have a recess that is formed by other process steps. The first passivation gas and process parameters may be selected to provide good selectivity to the hard mask layer 130, although not required. In the illustrated example embodiment in FIG. 2A, the adsorption of the first passivation gas on the carbon-containing layer 120 is not selective to the hard mask layer 130, where the intermediate layer 170A is thereby formed over the carbon-containing layer 120 and the hard mask layer 130.

FIG. 2B illustrates the substrate 100 after a first exposure to the plasma of the second passivation gas, where the passivation layer 170B is formed. Similarly to the prior embodiment described above, the exposure to the plasma of the second passivation gas may modify the intermediate layer 170A chemically or physically to form the passivation layer 170B. Further, in certain embodiments, compared to the intermediate layer 170A, the passivation layer 170B may have improved etch resistivity, and thereby better side-wall passivation, in subsequent plasma etch process steps.

FIG. 2C illustrates the substrate 100 after the first anisotropic plasma etch process similar to the first anisotropic plasma etch process described in FIG. 1C. A vertical recess 180 is formed by removing the carbon-containing layer 120. In certain embodiments where the passivation layer 170B is also formed over the hard mask layer 130, as illustrated in FIG. 2C, the portion of the passivation layer 170B on side-walls of the hard mask layer 130 may improve a first anisotropic plasma etch process to form the vertical recess 180. Side-walls of the vertical recess 180 are not yet covered by the passivation layer 170B at this stage. The cyclic etch process may proceed to a second passivation series (plasma-off and -on passivation steps) to provide side-wall passivation for a next anisotropic plasma etch process. After the second passivation series, the substrate may be similar to FIG. 1E, and the following cycles are expected to produce similar structures (FIGS. 1E-1I).

Figure 3A:
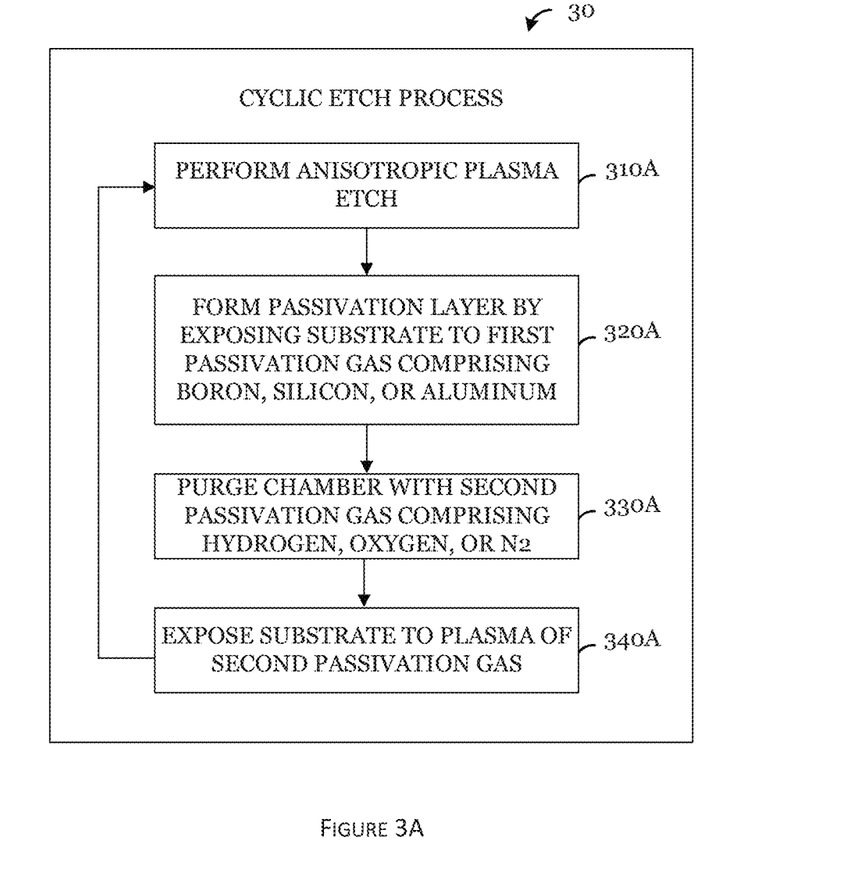
Figure 3B:
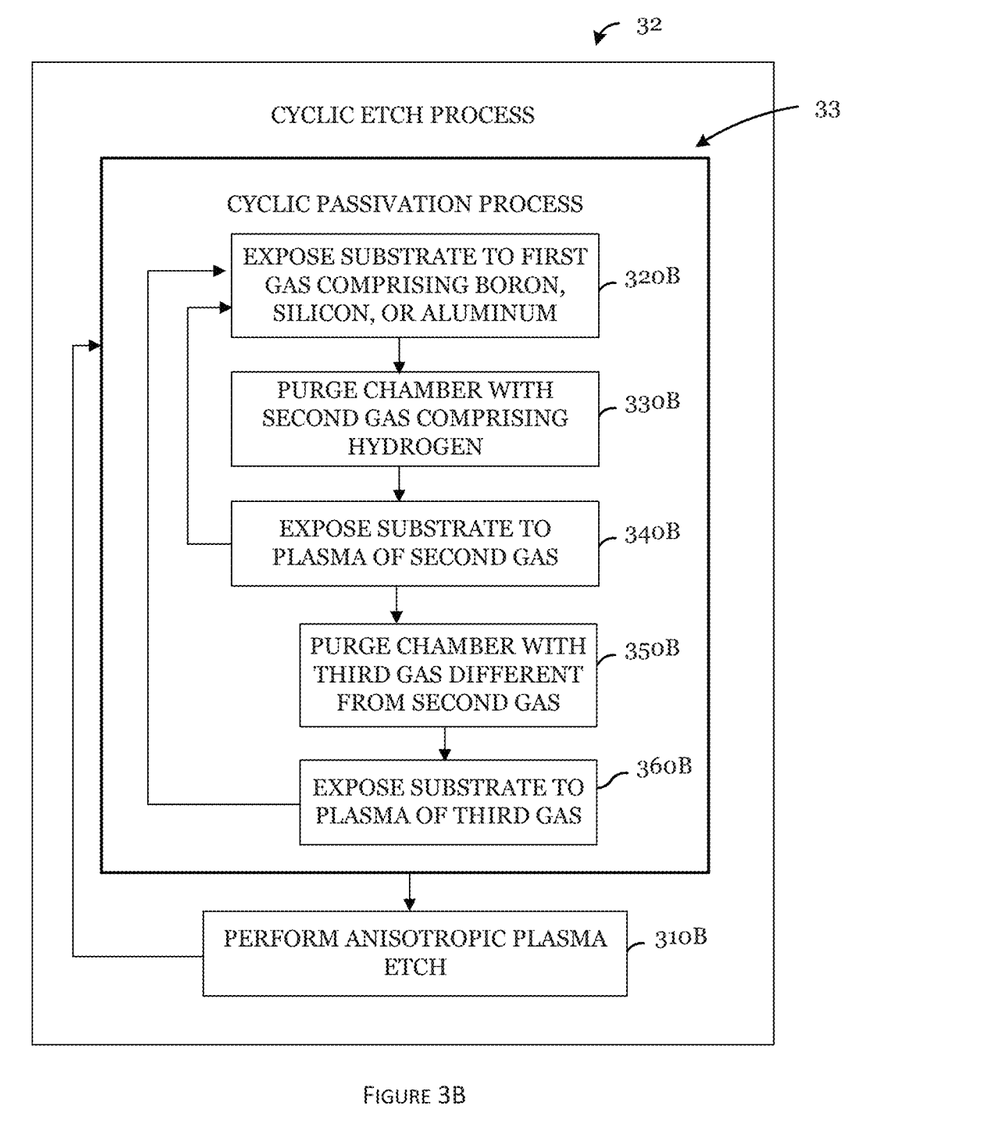
FIG. 3B illustrates an alternate embodiment process flow (e.g., FIGS. 2A-2C, 1E, 1K, and 1F-1I), and FIG. 3C illustrate another alternate embodiment process flow.
Figure 3C:
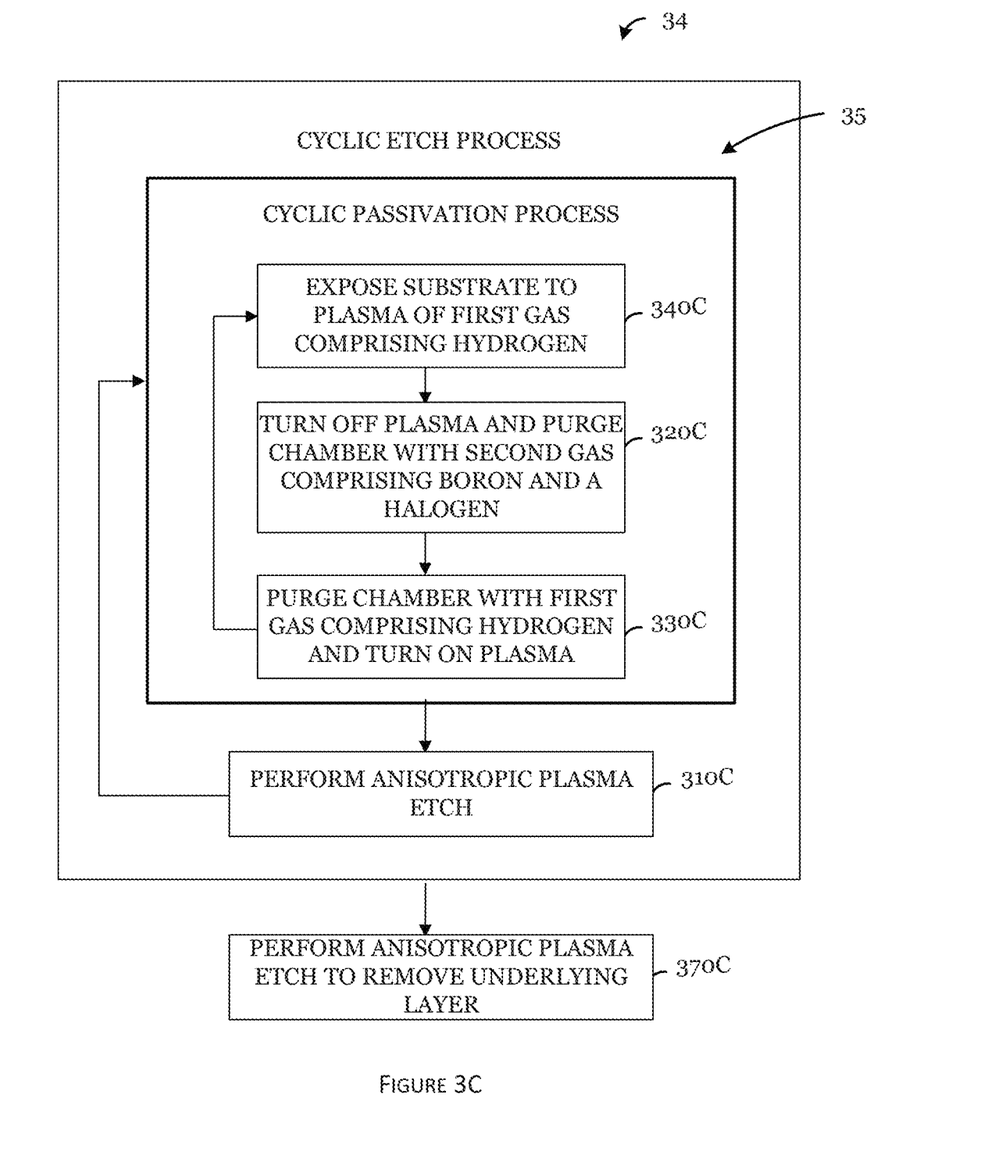
Figure 4:
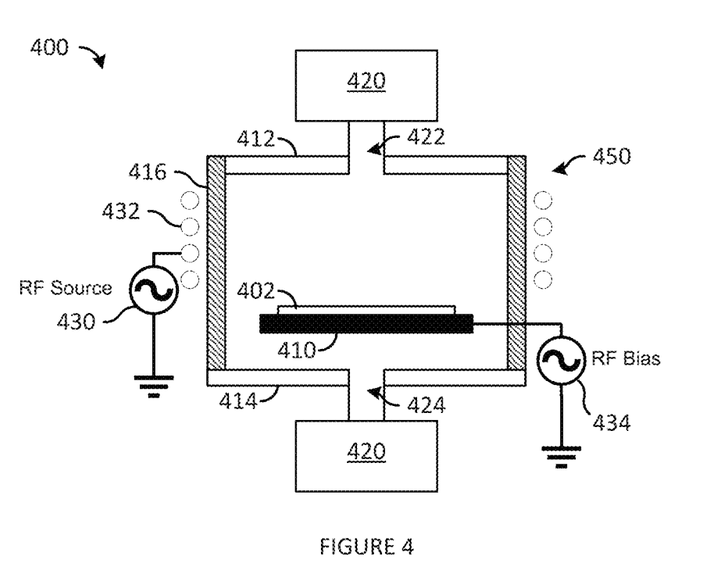
FIG. 4 illustrates an example plasma processing tool in accordance with an embodiment of this disclosure.

FIGS. 3A-3C illustrate process flow charts of methods of cyclic etch process in accordance with various embodiments, wherein FIG. 3A illustrates an embodiment process flow (e.g., FIGS. 1C-1I), FIG. 3B illustrates an alternate embodiment process flow (e.g., FIGS. 2A-2C, 1E, 1K, and 1F-1I), and FIG. 3C illustrate another alternate embodiment process flow comprising an anisotropic plasma etch after the cyclic etch process. These process flows can be followed with the figures discussed above and hence will not be described again.

FIG. 3A illustrates an embodiment process flow of a cyclic etch process in a plasma processing chamber (e.g., FIGS. 1C-1I). A cyclic etch process 30 starts with performing an anisotropic plasma etch on a substrate comprising a carbon-containing layer to form a vertical recess in the carbon-containing layer (block 310A) (e.g., FIG. 1C). Next, the substrate is exposed to a first passivation gas comprising boron, silicon, or aluminum in absence of a plasma (plasma-off passivation step) to form a passivation layer (block 320A) (e.g., FIG. 1D). The plasma processing chamber comprising the substrate is then purged with a second passivation gas comprising hydrogen, oxygen, or molecular nitrogen ($N_2$) (block 330A). Lastly, the substrate is exposed to a plasma of the second passivation gas (plasma-on passivation step) (block 340A) (e.g., FIG. 1E). This sequence may be cycled to etch the carbon-containing layer stepwise to form a high aspect ratio feature. A plurality of cycles may be performed to achieve a desired etch level (e.g., FIGS. 1F-1I).

FIG. 3B illustrates an alternate embodiment process flow (e.g., FIGS. 2A-2C, 1E, 1K, and 1F-1I), where a cyclic etch process 32 starts with performing a cyclic passivation process 33. The cyclic passivation process 33 starts with exposing a substrate to a first gas comprising boron, silicon, or aluminum (plasma-off passivation step) (block 320B) (e.g., FIG. 2A). A plasma processing chamber is then purged with a second gas comprising hydrogen (block 330B), followed by exposing the substrate to a plasma of the second gas (plasma-on passivation step) (block 340B) (e.g., FIG. 2B). These three steps (blocks 320B, 330B, and 340B) may be repeated. Optionally, the cyclic passivation process 33 may proceed to purging the plasma processing chamber with a third gas comprising $H_2$, $N_2$, $CH_4$, HBr, $CH_3F$, $H_2O$, or $NH_3$ (block 350B), followed by exposing the substrate to a plasma of the third gas (block 360B) (e.g., FIG. 1K). These five steps (blocks 320B, 330B, 340B, 350B, and 360B) may be repeated. The cyclic passivation process 33 may be completed after any of the exposures (blocks 320B, 340B, or 360B). After completing the cyclic passivation process 33, an anisotropic plasma etch is performed (block 310B), and the anisotropic plasma etch (block 310B) and the cyclic passivation process 33 may be repeated achieve a desired etch level (e.g., FIGS. 2A-2C and 1E-1I).

FIG. 3C illustrate another alternate embodiment process flow comprising an anisotropic plasma etch (e.g., FIG. 1J) after the cyclic etch process. A cyclic etch process 34 may start with a cyclic passivation process 35. The cyclic passivation process 35 starts with exposing a substrate comprising a carbon-containing layer to a plasma of a first gas comprising a hydrogen-containing gas (plasma-on passivation step) (block 340C). Next, a power to the plasma is turned off and a process chamber is purged with a second gas comprising boron and a halogen (plasma-off passivation step) (block 320C). The process chamber is then purged with the first gas and the power to the plasma is turned on (block 330C). These three steps may be repeated to complete a cycle of the cyclic passivation process 35. After completing the cyclic passivation process 35, an anisotropic plasma etch is performed (block 310C), and the anisotropic plasma etch (block 310C) and the cyclic passivation process 35 may be repeated achieve a desired etch level and form a high-aspect ratio feature of the carbon-containing layer. After completing the cyclic etch process 34, a second anisotropic plasma etch may be performed to remove an underlying layer using the carbon-containing layer as an etch mask.

In various embodiments of the disclosure, the cyclic etch process may be performed in a plasma processing chamber. An example plasma processing tool for the embodiment methods is illustrated in FIG. 4.

In FIG. 4, a plasma processing system 400 comprises a plasma processing chamber 450 configured to sustain plasma directly above a substrate 402 loaded onto a substrate holder 410. A process gas may be introduced to the plasma processing chamber 450 through a gas inlet 422 and may be pumped out of the plasma processing chamber 450 through a gas outlet 424. The gas inlet 422 and the gas outlet 424 may comprise a set of multiple gas inlets and gas outlets, respectively. The gas flow rates and chamber pressure may be controlled by a gas flow control system 420 coupled to the gas inlet 422 and the gas outlet 424. The gas flow control system 420 may comprise various components such as high pressure gas canisters, valves (e.g., throttle valves), pressure sensors, gas flow sensors, vacuum pumps, pipes, and electronically programmable controllers. An RF bias power source 434 and an RF source power source 430 may be coupled to respective electrodes of the plasma processing chamber 450. The substrate holder 410 may also be the electrode coupled to the RF bias power source 434. The RF source power source 430 is shown coupled to a helical electrode 432 coiled around a dielectric sidewall 416. In FIG. 4, the gas inlet 422 is an opening in a top plate 412 and the gas outlet 424 is an opening in a bottom plate 414. The top plate 412 and bottom plate 414 may be conductive and electrically connected to the system ground (a reference potential).

The configuration of the plasma processing system 400 described above is by example only. In alternative embodiments, various alternative configurations may be used for the plasma processing system 400. For example, inductively coupled plasma (ICP) may be used with RF source power coupled to a planar coil over a top dielectric cover, or capacitively coupled plasma (CCP) generated using a disc-shaped top electrode in the plasma processing chamber 450, the gas inlet and/or the gas outlet may be coupled to the sidewall, etc. Pulsed RF power sources and pulsed DC power sources may also be used in some embodiments (as opposed to continuous wave RF power sources). Further, microwave plasma (MW) or other suitable systems may be used. In various embodiments, the RF power, chamber pressure, substrate temperature, gas flow rates and other plasma process parameters may be selected in accordance with the respective process recipe. In some embodiments, the plasma processing system 400 may be a resonator such as a helical resonator. In one embodiment, a plasma system suitable for generating high density radicals for $H_2$ plasma may be used.

In addition, embodiments of the present invention may be also applied to remote plasma systems as well as batch systems. For example, the substrate holder may be able to support a plurality of wafers that are spun around a central axis as they pass through different plasma zones.

As described in various embodiments, passivation layer formed concurrently with the plasma etching process helps prevents or reduce bowing, side-wall roughness, and striation. In various embodiments, the side-wall passivation steps may comprise the formation of a passivation layer using a first passivation gas in the absence of a plasma (plasma-off passivation step), followed by a plasma treatment with a second passivation gas (plasma-on passivation step). The use of the plasma-off and -on passivation steps in various embodiments may offer a better side-wall passivation than the use of only one of the two steps. In the formation of a high aspect ratio feature of the carbon-containing layer, the embodiment methods based on the plasma-off and -on passivation may advantageously mitigate bowing and striation, and improve the side-wall surface roughness without compromising the etch rate, thereby providing a carbon mask with an improved quality. A better carbon mask performance in subsequent etch processes enabled by the embodiment methods may improve the process efficiency of the overall device fabrication. Further, the embodiment methods may offer benefits of power efficiency and longer chamber lifetime by using less plasma (e.g., more wafers can be processed before the chamber walls of the plasma processing chamber have to be repaired/replaced).

Example embodiments of the invention are summarized here. Other embodiments can also be understood from the entirety of the specification as well as the claims filed herein.

Example 1. A method for processing a substrate includes performing a cyclic process including a plurality of cycles, where the cyclic process includes: forming, in a plasma processing chamber, a passivation layer over sidewalls of a recess in a carbon-containing layer, by exposing the substrate to a first gas including boron, silicon, or aluminum, the carbon-containing layer being disposed over a substrate, purging the plasma processing chamber with a second gas including a hydrogen-containing gas, an oxygen-containing gas, or molecular nitrogen, and exposing the substrate to a plasma generated from the second gas, where each cycle of the plurality of cycles extends the recess vertically into the carbon-containing layer.

Example 2. The method of example 1, where the cyclic process further includes: extending the recess in the carbon-containing layer with a second plasma generated from a third gas including an oxygen-containing gas, a sulfur-containing gas, a nitrogen containing gas, or a hydrogen-containing gas.

Example 3. The method of one of examples 1 or 2, further including, after exposing a major surface of the substrate, repeating the exposing the substrate to a first gas, purging the plasma processing chamber, and exposing the substrate to a plasma to extend the passivation layer to the substrate.

Example 4. The method of one of examples 1 to 3, further including: before forming the passivation layer, forming the recess by performing an anisotropic plasma etch process by using an etch mask including a patterned mask layer over the carbon-containing layer, the substrate including the carbon-containing layer and the patterned mask layer.

Example 5. The method of one of examples 1 to 4, where the patterned mask layer includes silicon nitride, silicon oxide ($SiO_2$), or silicon oxynitride (SiON).

Example 6. The method of one of examples 1 to 5, where the anisotropic plasma etch process is performed with an etch gas includes an oxygen-containing gas, a sulfur-containing gas, a nitrogen containing gas, or a hydrogen-containing gas.

Example 7. The method of one of examples 1 to 6, where the carbon-containing layer includes amorphous carbon.

Example 8. The method of one of examples 1 to 7, further including forming the carbon-containing layer over the substrate by coating a spin-on carbon hard mask (SOH) material or a silicon-containing anti-reflective coating film (SiARC).

Example 9. The method of one of examples 1 to 8, where the first gas includes $BCl_3$, $BH_3$, $BBr_3$, $SiClH_{4-x}$ (x=0-4), $Si_2Cl_xH_{6-x}$ (x=0-6), $AlCl_3$, or $AlF_x(CH_3)_{3-x}$ (x=0-2).

Example 10. The method of one of examples 1 to 9, where the hydrogen-containing gas comprises $H_2$, $H_2O$, $CH_4$, HBr, $CH_3F$, $CH_4$, HBr, $CH_3F$, or $NH_3$, the oxygen-containing gas comprises $O_2$, CO, $CO_2$, or $H_2O$, and the nitrogen-containing gas comprises $N_2$ or $NH_3$.

Example 11. A method for processing a substrate includes performing a cyclic passivation process in a plasma processing chamber having a plasma source, the cyclic passivation process including a plurality of cycles, where a cycle of the cyclic passivation process includes: forming a passivation layer by exposing the substrate to a first gas including boron, silicon, or aluminum without powering the plasma source, the substrate including a carbon-containing layer, the first gas interacting with the carbon-containing layer to form the passivation layer, purging the plasma processing chamber with a second gas including hydrogen, and exposing the substrate to a plasma generated from the second gas by powering the plasma source.

Example 12. The method of example ii, where the first gas includes $BCl_3$, $BH_3$, $BBr_3$, $SiCl\,H_{4-x}$ (x=0-4), $Si_2Cl_xH_{6-x}$ (x=0-6), $AlCl_3$, or $AlF_x(CH_3)_{3-x}$ (x=0-2) and where the second gas includes hydrogen containing plasmas.

Example 13. The method of one of examples 11 or 12, where the second gas includes $H_2$, $N_2$, $O_2$, CO, $CO_2$, $H_2O$, $CH_4$, HBr, $CH_3F$, $NH_3$, $CH_4$, HBr, $CH_3F$, $H_2O$, or $NH_3$.

Example 14. The method of one of examples 11 to 13, further including performing an anisotropic plasma etch process to pattern the carbon-containing layer using an etch gas including an oxygen-containing gas, a sulfur-containing gas, a nitrogen containing gas, or a hydrogen-containing gas, where the pattern includes a vertical recess in the carbon-containing layer.

Example 15. The method of one of examples 11 to 14, where the cycle of the cyclic passivation process further includes: purging the plasma processing chamber with a third gas; and exposing the substrate to a third plasma of a third gas, where the third gas includes $H_2$, $N_2$, $CH_4$, HBr, $CH_3F$, $H_2O$, $O_2$, or $NH_3$, the third gas being different from the second gas.

Example 16. A method for processing a substrate includes performing a plurality of cycles of a cyclic etch process to form a recess in a carbon-containing layer of a substrate loaded in a process chamber, each cycle including: forming a passivation layer from the carbon-containing layer by exposing the substrate to a plasma formed from a first gas including a hydrogen-containing gas, after turning OFF power to the plasma, purging the process chamber with a second gas including boron and a halogen, and purging the process chamber with the first gas and turning ON power to the plasma.

Example 17. The method of example 16, where a cycle of the plurality of cycles further includes extending the recess by performing a first plasma etch process to anisotropically remove the carbon-containing layer exposed by a first etch mask.

Example 18. The method of one of examples 16 or 17, further including, after the cyclic etch process, performing a second plasma etch process to anisotropically remove an underlying layer using the carbon-containing layer as a second etch mask.

Example 19. The method of one of examples 16 to 18, the underlying layer includes oxide, silicon oxide ($SiO_2$), silicon nitride, silicon oxynitride (SiON), silicon carbide, titanium nitride, or tantalum nitride.

Example 20. The method of one of examples 16 to 19, the recess has an aspect ratio between 5 and 100 after performing the plurality of cycles.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
    performing a cyclic process comprising a plurality of cycles, wherein the cyclic process comprises:
        forming, in a plasma processing chamber, a passivation layer over sidewalls of a recess in a carbon-containing layer, by
            exposing the substrate to a first gas comprising boron, silicon, or aluminum, the carbon-containing layer being disposed over a substrate,
            purging the plasma processing chamber with a second gas comprising a hydrogen-containing gas, an oxygen-containing gas, or nitrogen-containing gas, and
            exposing the substrate to a plasma generated from the second gas,
    wherein each cycle of the plurality of cycles extends the recess vertically into the carbon-containing layer.

2. The method of claim 1, wherein the cyclic process further comprises:
    extending the recess in the carbon-containing layer with a second plasma generated from a third gas comprising an oxygen-containing gas, a sulfur-containing gas, a nitrogen containing gas, or a hydrogen-containing gas.

3. The method of claim 2, further comprising, after exposing a major surface of the substrate, repeating the exposing the substrate to a first gas, purging the plasma processing chamber, and exposing the substrate to a plasma to extend the passivation layer to the substrate.

4. The method of claim 1, further comprising:
    before forming the passivation layer, forming the recess by performing an anisotropic plasma etch process by using an etch mask comprising a patterned mask layer over the carbon-containing layer, the substrate comprising the carbon-containing layer and the patterned mask layer.

5. The method of claim 4, wherein the patterned mask layer comprises silicon nitride, silicon oxide (SiO2), or silicon oxynitride (SiON).

6. The method of claim 4, wherein the anisotropic plasma etch process is performed with an etch gas comprises an oxygen-containing gas, a sulfur-containing gas, a nitrogen containing gas, or a hydrogen-containing gas.

7. The method of claim 1, wherein the carbon-containing layer comprises amorphous carbon.

8. The method of claim 1, further comprising forming the carbon-containing layer over the substrate by coating a spin-on carbon hard mask (SOH) material or a silicon-containing anti-reflective coating film (SiARC).

9. The method of claim 1, wherein the first gas comprises BCl3, BH3, BBr3, SiClxH4-x (x=0-4), Si2ClxH6-x (x=0-6), AlCl3, or AlFx(CH3)3-x (x=0-2).

10. The method of claim 1, wherein the hydrogen-containing gas comprises H2, H2O, CH4, HBr, CH3F, CH4, HBr, CH3F, or NH3, the oxygen-containing gas comprises O2, CO, CO2, or H2O, and the nitrogen-containing gas comprises N2 or NH3.

11. A method for processing a substrate, the method comprising:
performing a cyclic passivation process in a plasma processing chamber having a plasma source, the cyclic passivation process comprising a plurality of cycles, wherein a cycle of the cyclic passivation process comprises:
forming a passivation layer by
exposing the substrate to a first gas comprising boron, silicon, or aluminum without powering the plasma source, the substrate comprising a carbon-containing layer, the first gas interacting with the carbon-containing layer to form the passivation layer,
purging the plasma processing chamber with a second gas comprising hydrogen, and
exposing the substrate to a plasma generated from the second gas by powering the plasma source.

12. The method of claim 11, wherein the first gas comprises $BCl_3$, $BH_3$, $BBr_3$, $SiCl_xH_{4-x}$ (x=0-4), $Si_2Cl_xH_{6-x}$ (x=0-6), $AlCl_3$, or $AlF_x(CH_3)_{3-x}$ (x=0-2).

13. The method of claim 11, wherein the second gas comprises $H_2$, $N_2$, $O_2$, $CO$, $CO_2$, $H_2O$, $CH_4$, $HBr$, $CH_3F$, $NH_3$, $CH_4$, $HBr$, $CH_3F$, $H_2O$, or $NH_3$.

14. The method of claim 11, further comprising
performing an anisotropic plasma etch process to pattern the carbon-containing layer using an etch gas comprising an oxygen-containing gas, a sulfur-containing gas, a nitrogen containing gas, or a hydrogen-containing gas, wherein the pattern comprises a vertical recess in the carbon-containing layer.

15. The method of claim 11, wherein the cycle of the cyclic passivation process further comprises:
purging the plasma processing chamber with a third gas; and
exposing the substrate to a third plasma of a third gas, wherein the third gas comprises $H_2$, $N_2$, $CH_4$, $HBr$, $CH_3F$, $H_2O$, $O_2$, or $NH_3$, the third gas being different from the second gas.

16. A method for processing a substrate, the method comprising:
performing a plurality of cycles of a cyclic etch process to form a recess in a carbon-containing layer of a substrate loaded in a process chamber, each cycle comprising:
forming a passivation layer from the carbon-containing layer by
exposing the substrate to a plasma formed from a first gas comprising a hydrogen-containing gas,
after turning OFF power to the plasma, purging the process chamber with a second gas comprising boron and a halogen, and
purging the process chamber with the first gas and turning ON power to the plasma.

17. The method of claim 16, wherein a cycle of the plurality of cycles further comprises extending the recess by performing a first plasma etch process to anisotropically remove the carbon-containing layer exposed by a first etch mask.

18. The method of claim 17, further comprising, after the cyclic etch process, performing a second plasma etch process to anisotropically remove an underlying layer using the carbon-containing layer as a second etch mask.

19. The method of claim 18, the underlying layer comprises oxide, silicon oxide ($SiO_2$), silicon nitride, silicon oxynitride (SiON), silicon carbide, titanium nitride, or tantalum nitride.

20. The method of claim 16, the recess has an aspect ratio between 5 and 100 after performing the plurality of cycles.

* * * * *